(12) United States Patent
Chung et al.

(10) Patent No.: US 8,487,382 B2
(45) Date of Patent: Jul. 16, 2013

(54) DEVICE SCHEME OF HKMG GATE-LAST PROCESS

(75) Inventors: Sheng-Chen Chung, Jhubei (TW); Kong-Beng Thei, Pao-Shan Village (TW); Harry Chuang, Hsinchu (TW)

(73) Assignee: Taiwan Semiconductor Maufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/292,665

(22) Filed: Nov. 9, 2011

(65) Prior Publication Data

US 2012/0056269 A1    Mar. 8, 2012

Related U.S. Application Data

(62) Division of application No. 12/536,878, filed on Aug. 6, 2009, now Pat. No. 8,058,119.

(60) Provisional application No. 61/092,305, filed on Aug. 27, 2008.

(51) Int. Cl.
*H01L 21/70* (2006.01)

(52) U.S. Cl.
USPC .... 257/369; 257/407; 257/412; 257/E27.064; 257/E29.16

(58) Field of Classification Search
USPC ............. 257/369, 407, 412, E27.064, E29.16
See application file for complete search history.

(56) References Cited

U.S. PATENT DOCUMENTS

| | | | |
|---|---|---|---|
| 6,255,698 B1 | 7/2001 | Gardner et al. | |
| 6,365,450 B1 | 4/2002 | Kim | |
| 6,410,376 B1 | 6/2002 | Ng et al. | |
| 6,586,288 B2 | 7/2003 | Kim et al. | |
| 6,727,129 B1 | 4/2004 | Nakajima | |
| 6,797,599 B2 | 9/2004 | Vixokay et al. | |
| 7,381,619 B2 | 6/2008 | Wang et al. | |
| 7,390,709 B2 | 6/2008 | Doczy et al. | |
| 7,564,102 B2 | 7/2009 | Yoshihara | |
| 7,622,340 B2 | 11/2009 | Akasaka et al. | |
| 7,888,195 B2 * | 2/2011 | Lin et al. | 438/199 |

(Continued)

FOREIGN PATENT DOCUMENTS

| | | |
|---|---|---|
| CN | 1450658 | 10/2003 |
| CN | 1729565 | 2/2006 |

OTHER PUBLICATIONS

Chinese Patent Office, Office Action dated Dec. 2, 2010, Application No. 200910168339.1, 7 pages.

*Primary Examiner* — Bac Au
(74) *Attorney, Agent, or Firm* — Haynes and Boone, LLP

(57) ABSTRACT

The present disclosure provides a method for making metal gate stacks of a semiconductor device. The method includes forming a high k dielectric material layer on a semiconductor substrate; forming a conductive material layer on the high k dielectric material layer; forming a dummy gate in a n-type field-effect transistor (nFET) region and a second dummy gate in a pFET region employing polysilicon; forming an inter-level dielectric (ILD) material on the semiconductor substrate; applying a first chemical mechanical polishing (CMP) process to the semiconductor substrate; removing the polysilicon from the first dummy gate, resulting in a first gate trench; forming a n-type metal to the first gate trench; applying a second CMP process to the semiconductor substrate; removing the polysilicon from the second dummy gate, resulting in a second gate trench; forming a p-type metal to the second gate trench; and applying a third CMP process to the semiconductor substrate.

20 Claims, 10 Drawing Sheets

U.S. PATENT DOCUMENTS

| | | |
|---|---|---|
| 7,902,058 B2 | 3/2011 | Datta et al. |
| 2005/0250258 A1* | 11/2005 | Metz et al. .................... 438/142 |
| 2008/0283929 A1 | 11/2008 | Nabatame |
| 2009/0181504 A1 | 7/2009 | Lin et al. |
| 2009/0230479 A1 | 9/2009 | Hsu et al. |
| 2009/0258482 A1* | 10/2009 | Lin et al. ....................... 438/585 |

* cited by examiner

Table 1

| Film | RPG Scheme (P patterns first) | | | | | | | |
|---|---|---|---|---|---|---|---|---|
| | Proposal A | | Proposal B | | Proposal C | | Proposal D | |
| | NMOS | PMOS | NMOS | PMOS | NMOS | PMOS | NMOS | PMOS |
| IL | V | V | V | V | V | V | V | V |
| HK | V | V | V | V | V | V | V | V |
| TiN | V | V | V | V | V | V | V | V |
| TaN | X | X | V | V | V | V | X | X |
| TiN | V | V | X | V | X | X | X | X |
| WN | X | V | X | V | X | V | X | V |
| TiAl | V | V | V | V | V | V | V | V |
| W or Al | V | V | V | V | V | V | V | V |

Proposal A: Evaluate TiN thickness for NMOS
Proposal B: TaN for etching stop layer.
Proposal C: TaN for etch stop layer. Evaluate WN thickness for PMOS
Proposal D: Evaluate WN thickness for PMOS

Table 2

| Film | RPG Schemes ( N pattern first) | | | | | |
|---|---|---|---|---|---|---|
| | Proposal A | | Proposal B | | Proposal C | |
| | NMOS | PMOS | NMOS | PMOS | NMOS | PMOS |
| IL | V | V | V | V | V | V |
| HK | V | V | V | V | V | V |
| TiN | V | V | V | V | V | V |
| TaN | X | X | V | V | V | X |
| TiAl | V | X | V | X | V | X |
| TiN | V | V | V | V | V | V |
| WN | V | V | V | V | V | V |
| W or Al | V | V | V | V | V | V |

Proposal A: TiAl patterning, TIN stop layer
Proposal B: TiAl patterning, TaN stop layer
Proposal C: TaN/TiAl patterning, TIN stop layer
*Proposal of w/o WN were for NMOS WF tuning.*

DEVICE SCHEME OF HKMG GATE-LAST PROCESS

PRIORITY DATA

This application is a divisional of U.S. patent application Ser. No. 12/536,878 filed on Aug. 6, 2009, now U.S. Pat. No. 8,058,119 issued Nov. 15, 2011, which claims priority to Provisional Application Ser. No. 61/092,305, filed on Aug. 27, 2008, entitled "A NOVEL DEVICE SCHEME OF HKM GATE-LAST PROCESS", each of which is hereby incorporated by reference in its entirety.

BACKGROUND

When a semiconductor device such as a metal-oxide-semiconductor field-effect transistors (MOSFETs) is scaled down through various technology nodes, high k dielectric material and metal are adopted to form a gate stack. However, in a method to form metal gate stacks for nMOS transistors and pMOS transistors, various issues may arise when integrating the processes and materials for this purpose. For example, the pMOS transistors may have a poor performance. In another example, the work functions for nMOS transistor and pMOS transistors cannot be tuned independently and properly.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

Figure 1:
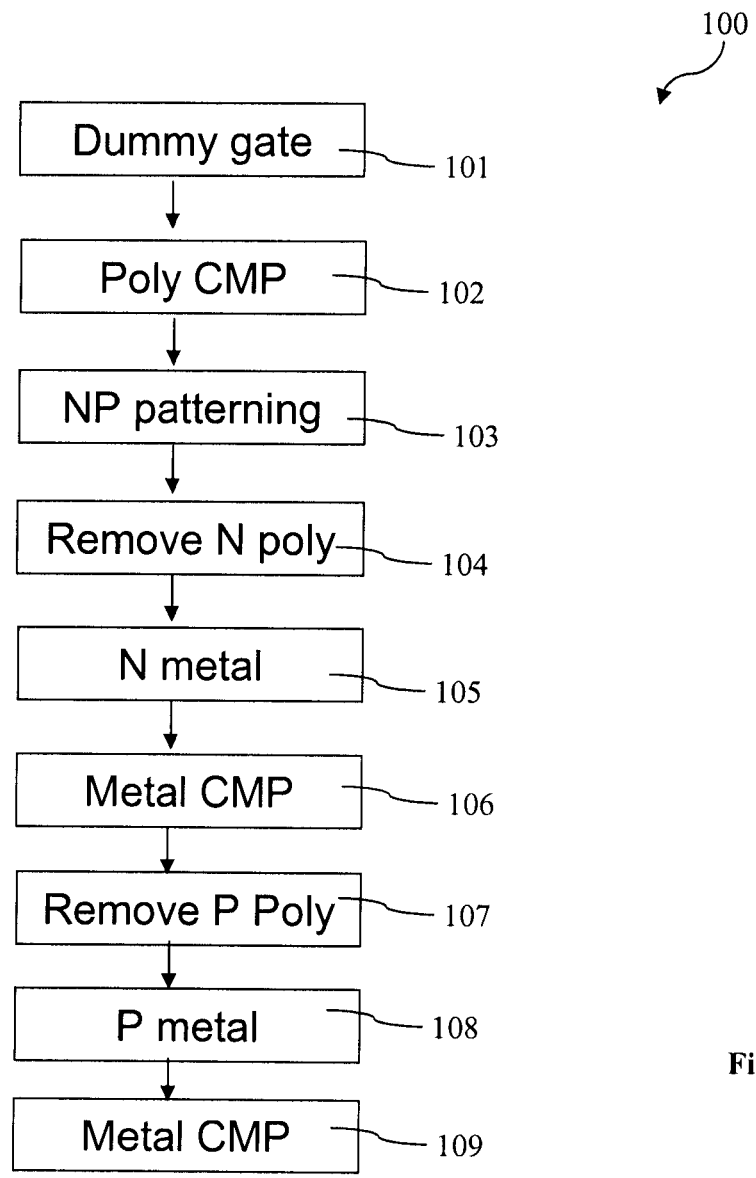
FIG. 1 is a flowchart of a method making a semiconductor device having metal gate stacks constructed according to various aspects of the present disclosure.

Table 1 and Table 2 provide various schemes of high k and metal gate stacks constructed according to aspects of the present disclosure in several embodiments.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

A Novel Structure For Replacement Polysilicon Gate (RPG) Process

Figure 2:
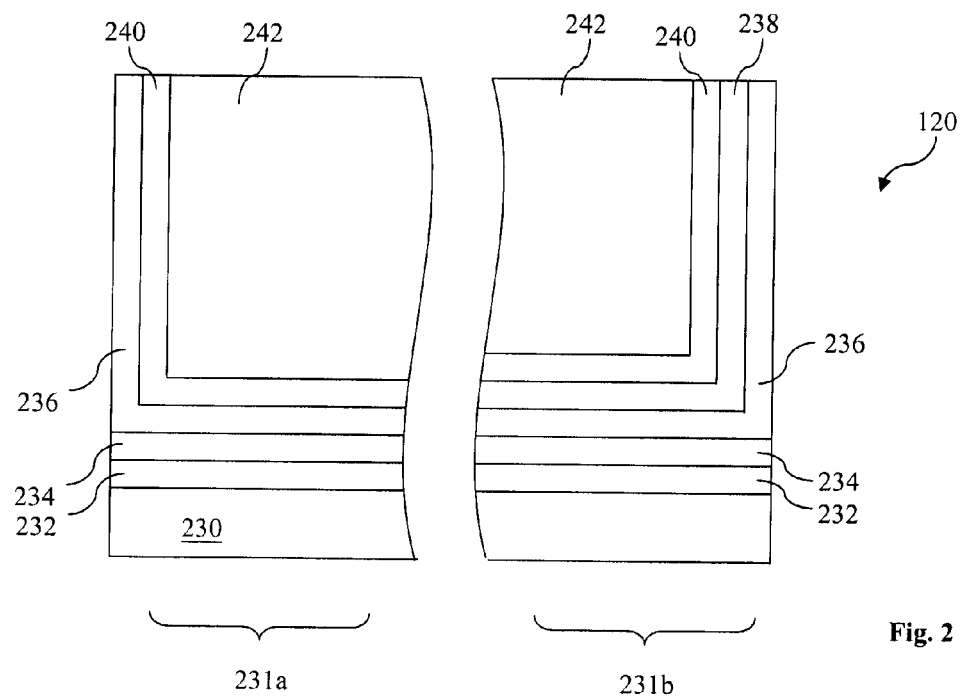
FIG. 2 is a sectional view of one embodiment of a semiconductor structure having metal gate stacks at a fabrication stage constructed according to various aspects of the present disclosure.
Figure 3:
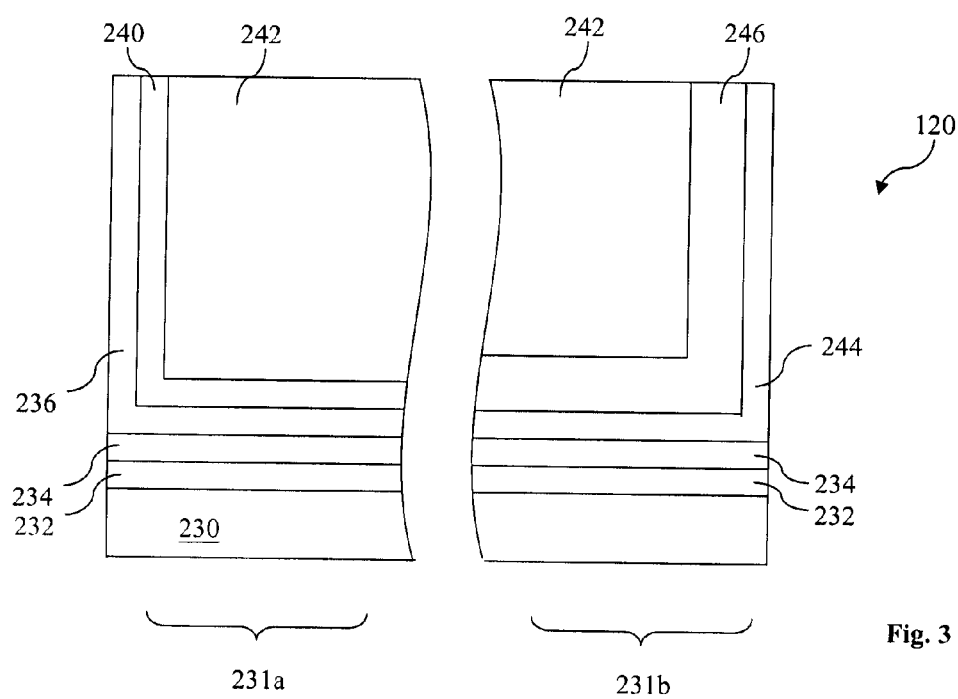
FIG. 3 is a sectional view of another embodiment of a semiconductor structure having metal gate stacks at a fabrication stage constructed according to various aspects of the present disclosure.

FIG. 1 is a flowchart of one embodiment of a method 100 making a semiconductor device having a metal gate stack constructed according to various aspects of the present disclosure. FIG. 2 is a sectional view of one embodiment of a semiconductor structure 120 having a metal gate stack at a fabrication stage. FIG. 3 is a sectional view of another embodiment of a semiconductor structure 140 having a metal gate stack at a fabrication stage. The various semiconductor structure and the method 100 of making the same are collectively described with reference to FIGS. 1 through 3.

The method 100 begins at step 101 by forming dummy gate stacks on a semiconductor substrate 230. The semiconductor substrate includes silicon. Alternatively, the substrate includes germanium, silicon germanium or other proper semiconductor materials. The semiconductor substrate also includes various isolation features such as shallow trench isolation formed in the substrate to separate various devices. The semiconductor substrate also includes various doped regions such as n-wells, p-wells, light doped drain (LDD) regions and source/drain regions formed at various stages. In one exemplary embodiment, the semiconductor substrate includes a n-type field effect transistor (nFET) in a nFET region 231a and a p-type FET (pFET) in a pFET region 231b. In one example, the nFET and pFET include metal-oxide-semiconductor (MOS) FETs such as a nMOSFET and a pMOSFET. The semiconductor substrate also includes dummy gate stacks for the nFET and pFET. Particularly, the nFET and pFET include dummy gate stacks having high k dielectric material and polysilicon material. In another embodiments, the semiconductor substrate includes a plurality of nFET regions 231a and a plurality of pFET regions 231b.

In one embodiment of the forming the dummy gate stacks, a high k dielectric material layer 232 is formed on the semiconductor substrate. Additionally or alternatively, a silicon oxide layer (not shown) is formed on the semiconductor substrate 230 before the formation of the high k dielectric material layer 232 by a thermal oxidation or atomic layer deposition (ALD). A metal layer 234 is formed on the high k dielectric material layer 232. In one example, the metal layer 234 includes titanium nitride. The thickness of the titanium nitride metal gate layer is about 20 angstrom in one example. In another example, the thickness of the titanium nitride metal gate layer ranges between about 10 angstrom and about 30 angstrom.

In another embodiment, a tantalum nitride (TaN) layer is further formed on the titanium nitride layer 234. The thickness of the tantalum nitride layer is about 10 angstrom in one example. In another example, the thickness of the tantalum nitride layer ranges between about 5 angstrom and about 20 angstrom. Then a polysilicon layer (not shown) is formed on the tantalum nitride layer.

Thereafter, a polysilicon layer (not shown) is formed on the semiconductor substrate. Then the various material layers are patterned to form the dummy gate stacks. Additionally or alternatively, a LDD regions are formed by various ion implantation processes such that the LDD regions are aligned with the dummy gate stacks. The gate spacers are formed afterward by dielectric deposition and dry etching process. Then source and drain regions are formed by various ion implantation processes. An inter-level dielectric (ILD) layer (not shown) is formed on the semiconductor substrate and the dummy gate stacks.

The method 100 proceeds to next step 102 by applying a chemical mechanical polishing (CMP) process to polish the substrate such that the polysilicon is exposed. In another embodiment, a hard mask may be formed on the polysilicon and used to form the dummy gate stacks. In this case, the CMP process is applied to expose the hard mask and then an etching process such as a wet etch dip is applied to remove the hard mask, resulting an exposed polysilicon.

The method 100 proceeds to next step 103 by applying a patterning process to cover the pFET regions. In one example, a patterned photoresist layer is formed on the semiconductor substrate 230, covering the pFET regions 231b and leaving the nFET regions 231a open.

The method 100 proceeds to next step 104 by applying an etching process to remove polysilicon from the dummy gate stacks in the nFET regions, forming gate trenches in the nFET regions.

The method 100 proceeds to next step 105 by forming one or more n-type metal layers in the gate trenches of the nFETs. In one embodiment, the n-type metal layers include a tantalum nitride layer 236, with a thickness of about 10 angstrom in one example. The n-type metal layers additionally include a second metal layer 240, such as a titanium aluminum layer or a titanium aluminum nitride layer. The thickness of the second metal layer 240 is about 10 angstrom in one example. Additionally, the gate trenches in the nFET regions 231a are further filled with a metal material 242, such as tungsten or aluminum, using a chemical vapor deposition (CVD) process or other suitable process.

The method 100 proceeds to next step 106 by applying another CMP process to the semiconductor substrate 230 to polish the substrate and substantially remove the excessive metal materials above the substrate surface after the previous CMP process.

The method 100 proceeds to next step 107 by removing the dummy gate stacks in the pFETs. At this step, a patterning process is applied to the substrate 230 to cover the nFET regions. In one example, a patterned photoresist layer is formed on the semiconductor substrate, covering the nFET regions and leaving the pFET regions open. Then an etching process is applied to the substrate to remove polysilicon from the dummy gate stacks in the pFET regions, forming gate trenches therein.

The method 100 proceeds to next step 108 by forming one or more p-type metal layers in the gate trenches of the pFETs. In one embodiment illustrated in FIG. 2, the p-type metal layers include a tantalum nitride layer 236, a tungsten nitride layer 238 formed on the tantalum nitride layer 236, and a titanium aluminum (or titanium aluminum nitride) layer 240 formed on the tantalum nitride layer in one configuration. The tantalum nitride layer 236 includes a thickness of about 10 angstrom in one example. The thickness of the tungsten nitride layer is about 50 angstrom in one example. The titanium aluminum (or titanium aluminum nitride) layer 240 includes a thickness of about 10 angstrom. Additionally, the gate trenches in the pFET regions are further filled with a metal material such as tungsten or aluminum, using a chemical vapor deposition (CVD) process or other suitable process.

In another embodiment illustrated in FIG. 3, the p-type metal layers include a titanium nitride layer, with a thickness of about 40 angstrom in one example. The p-type metal layers additionally include a tungsten nitride layer. The thickness of the tungsten nitride layer is about 50 angstrom in one example. In another embodiment, the p-type metal layers include a tantalum nitride layer, with a thickness of about 10 angstrom in one example. The n-type metal layers include a titanium aluminum (TiAl) layer or a titanium aluminum nitride (TiAlN) layer, with a thickness of about 10 angstrom in one example. Furthermore, the p-type metal layers include tungsten nitride (WN) layer interposed between the tantalum nitride layer and the TiAl/TiAlN layer. The thickness of the WN layer is about 50 angstrom. Additionally, the gate trenches in the pFET regions are further filled with a metal material such as tungsten or aluminum.

The method 100 proceeds to next step 109 by applying another CMP process to the semiconductor substrate to polish the substrate and substantially remove the excessive metal materials above the substrate surface after the previous CMP process.

By the disclosed method, the metal gate stacks for nFETs and pFETs are formed with different compositions and configurations. The work functions for nFET and pFET regions are tuned independently. The performances of the nMOSFETs and pMOSFETs are optimized and enhanced. The issues associated with previous metal gate formation are eliminated or reduced.

A Novel Structure For HKMG Gate Last Process

Figure 4:
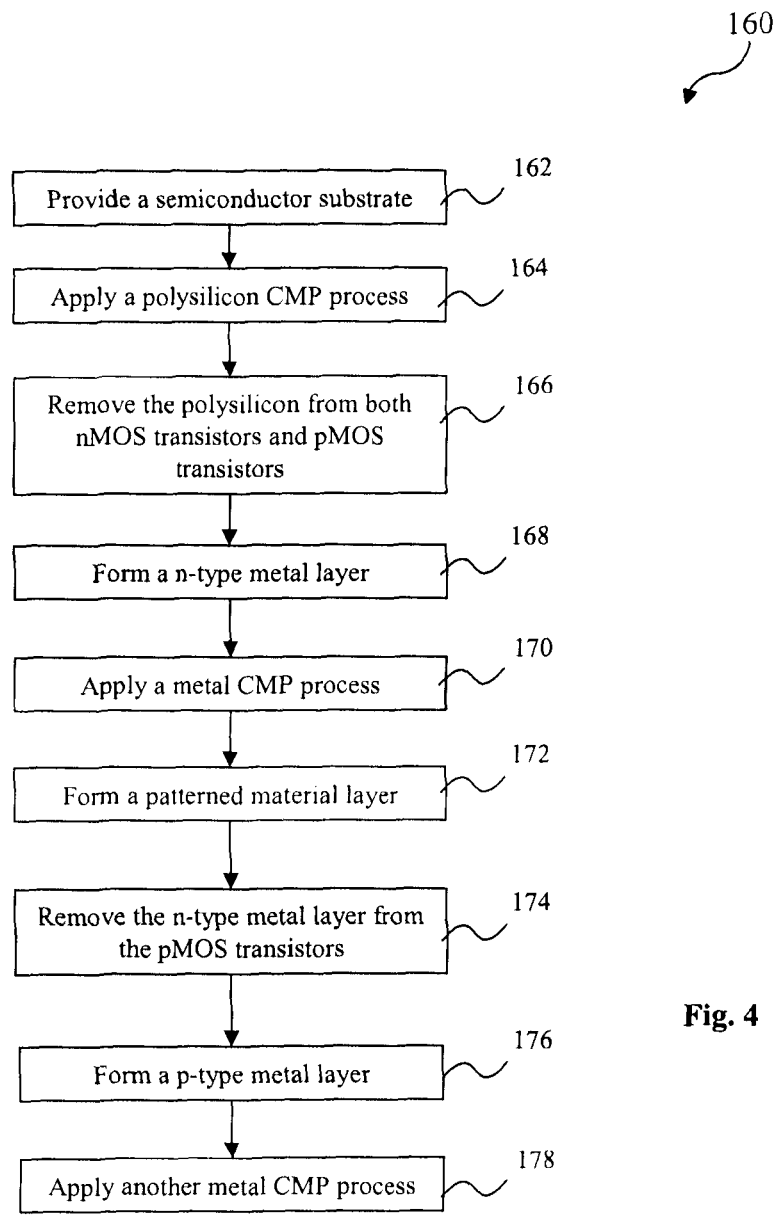
FIG. 4 is a flowchart of another embodiment of a method making a semiconductor device having metal gate stacks constructed according to aspects of the present disclosure.

FIG. 4 is a flowchart of one embodiment of a method 160 making a semiconductor device having a metal gate stack constructed according to various aspects of the present disclosure. The method 160 is described with reference to FIGS. 2 through 4.

The method 100 begins at step 162 by providing a semiconductor substrate. The semiconductor substrate includes silicon. Alternatively, the substrate includes germanium, silicon germanium or other proper semiconductor materials. The semiconductor substrate also includes various isolation features such as shallow trench isolation formed in the substrate to separate various devices. The semiconductor substrate also includes various doped regions such as n-wells, p-wells, light doped drain (LDD) regions and source/drain regions. The semiconductor substrate also includes dummy gate stacks for n-type field effect transistors (nFETs) and p-type FET (pFETs). In one embodiment, the nFETs and pFETs include metal-oxide-semiconductor (MOS) FETS such as nMOSFETs and pMOSFETs. Particularly, the nFETs include and pFETs include dummy gate stacks having high k dielectric material and polysilicon material.

In one embodiment of the forming the dummy gate stacks, a high k dielectric material layer is formed on the semiconductor substrate. Additionally or alternatively, a silicon oxide layer is formed on the semiconductor substrate before the formation of the high k dielectric material layer. The silicon oxide layer may be formed by thermal oxidation or ALD. A metal gate layer is formed on the high k dielectric material layer. In one example, the metal gate layer includes titanium nitride. The thickness of the titanium nitride metal gate layer is about 20 angstrom in one example. In another example, the thickness of the titanium nitride metal gate layer ranges between about 10 angstrom and about 30 angstrom.

In another embodiment, a tantalum nitride layer is formed on the titanium nitride layer as illustrated in FIG. 2. The thickness of the tantalum nitride layer is about 10 angstrom in one example. In another example, the thickness of the tantalum nitride layer ranges between about 5 angstrom and about 20 angstrom. In another embodiment, this metal layer is formed after the polysilicon removal.

Thereafter, polysilicon is formed on the semiconductor substrate. Then the various material layers are patterned to form the dummy gate stacks. Additionally or alternatively, a LDD regions are formed by various ion implantation processes such that the LDD regions are aligned with the dummy gate stacks. The gate spacers are formed afterward by dielectric deposition and dry etching process. Then source and drain regions are formed by various ion implantation processes. An inter-level dielectric (ILD) layer is formed on the semiconductor substrate and the dummy gate stacks.

The method 100 proceeds to step 164 by applying a chemical mechanical polishing (CMP) process to polish the substrate such that the polysilicon is exposed. In another embodiment, a hard mask may be formed on the polysilicon and used to form the dummy gate stacks. The CMP process is applied to expose the hard mask and then an etching process such as a wet etch dip is applied to remove the hard mask, resulting exposed polysilicon.

The method 100 proceeds to step 166 by applying an etching process to remove polysilicon from the dummy gate stacks in both the nFETs and pFETs, forming gate trenches in the nFET regions and pFET regions.

The method 100 proceeds to step 168 by forming one or more n-type metal layers in the gate trenches of the nFETs and pFETs. In one embodiment, the n-type metal layers include a tantalum nitride layer, with a thickness of about 10 angstrom in one example. The n-type metal layers additionally include a titanium aluminum layer or a titanium aluminum nitride layer. The thickness of this layer is about 10 angstrom in one example. In one embodiment, the gate trenches are further filled with a metal material such as tungsten or aluminum, using a chemical vapor deposition (CVD) process or other suitable process.

The method 100 proceeds to step 170 by applying another CMP process to the semiconductor substrate to polish the substrate and substantially remove the excessive metal materials above the substrate surface after the previous CMP process.

The method 100 proceeds to step 172 by applying a patterning process to cover the nFET regions. In one example, a patterned photoresist layer is formed on the semiconductor substrate, covering the nFET regions and leaving the pFET regions open.

The method 100 proceeds to step 174 by applying an etching process to remove the n metal layers from the pFET regions.

The method 100 proceeds to step 176 by forming one or more p-type metal layers in the gate trenches of the pFETs. In one embodiment illustrated in FIG. 3, the p-type metal layers include a titanium nitride layer, with a thickness of about 40 angstrom in one example. The p-type metal layers additionally include a tungsten nitride layer. The thickness of the tungsten nitride layer is about 50 angstrom in one example. In another embodiment, the p-type metal layers include a tantalum nitride layer, with a thickness of about 10 angstrom in one example. The n-type metal layers include a titanium aluminum (TiAl) layer or a titanium aluminum nitride (TiAlN) layer, with a thickness of about 10 angstrom in one example. Furthermore, the p-type metal layers include tungsten nitride (WN) layer interposed between the tantalum nitride layer and the TiAl/TiAlN layer. The thickness of the WN layer is about 50 angstrom, as illustrated in FIG. 2. Additionally, the gate trenches in the pFET regions are further filled with a metal material such as tungsten or aluminum, using a chemical vapor deposition (CVD) process or other suitable process.

The method 100 proceeds to step 178 by applying another CMP process to the semiconductor substrate to polish the substrate and remove the excessive metal materials above the substrate surface after the previous CMP process.

By the disclosed method, the metal gate stacks for nFETs and pFETs are formed with different compositions and configurations. The work functions for nFET and pFET regions are tuned independently. The performances of the nMOSFETs and pMOSFETs are optimized and enhanced. The issues associated with previous metal gate formation are eliminated or reduced.

In another embodiment, a tantalum nitride layer is formed in both nFET and pFET regions. The tantalum nitride layer has a thickness of about 10 angstrom in one example. Then a tungsten nitride (WN) layer is formed on the tantalum nitride layer and is further patterned such that the tantalum nitride layer in the nFET regions is removed by a method known in the art. The thickness of the WN layer is about 50 angstrom, as illustrated in FIG. 2. Then a titanium aluminum (TiAl) layer or a titanium aluminum nitride (TiAlN) layer is formed on the tantalum nitride layer of the nFET regions and on the WN layer of the pFET regions. In this case, the WN layer is interposed between the TiAl/TiAlN layer and the tantalum nitride layer in the pFET regions. The TiAl/TiAlN layer has a thickness of about 10 angstrom in one example. Additionally, the gate trenches in the pFET regions are further filled with a metal material such as tungsten or aluminum, using a chemical vapor deposition (CVD) process. Additionally, the disclosed metal gate stacks configured as illustrated in FIG. 2 or FIG. 3 are only two embodiments. Other suitable metal materials may be alternatively used and made by the method 160.

A Novel Device Schemes of HKMG Gate Last Process

FIGS. 5a through 5d are sectional views of various embodiments of a semiconductor structure having metal gate stacks constructed according to various aspects of the present disclosure. In various embodiments, the structures of FIGS. 5a through 5d include one or more patterned metal layers in PMOS transistors. The patterned metal layer(s) is(are) formed in PMOS transistors by deposition and etching processes. Thereafter, one or more other metal layers are formed to both PMOS transistors and NMOS transistors. Therefore, the method to form these structures are referred to as P pattern first in Table 1. Particularly, the structures of FIGS. 5a through 5d may be formed by the method 120 of FIG. 2, the method 140 of FIG. 3 or a combination thereof in various embodiments. The various semiconductor structures of FIGS. 5a through 5d are described with additional reference to Table 1.

Figure 5A:
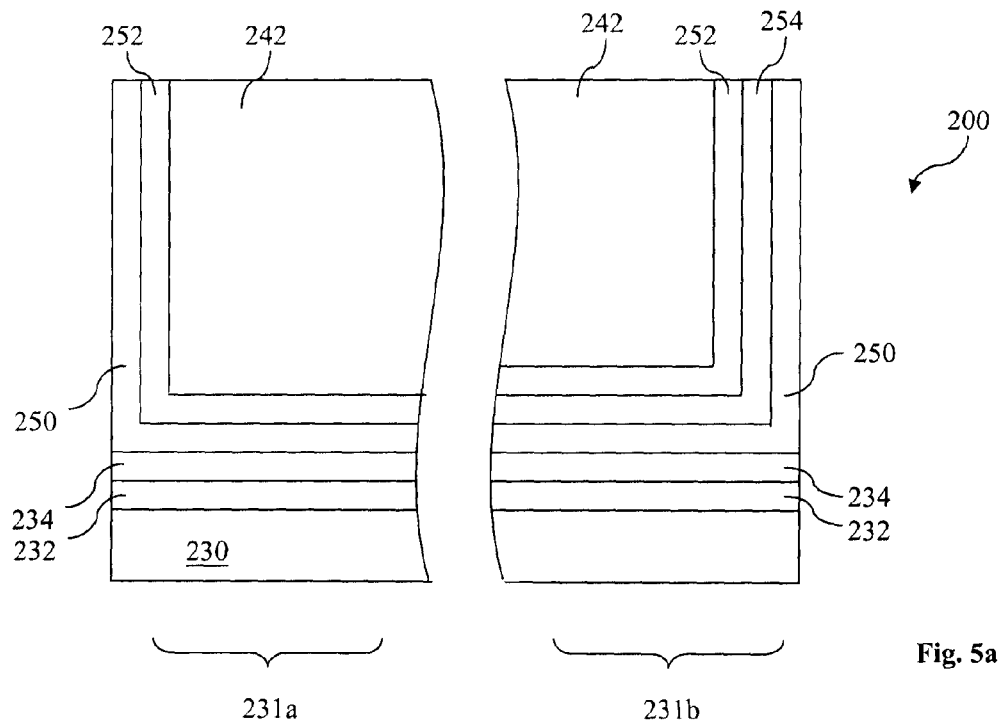
FIGS. 5a through 5d are sectional views of a semiconductor structure having metal gate stacks at a fabrication stage constructed according to various aspects of the present disclosure in various embodiments.

The semiconductor structure 200 is illustrated in FIG. 5a. The semiconductor structure 200 includes a semiconductor substrate 230 having various doped region, such as n-wells, p-wells, LDD regions, and source/drain regions. The semiconductor substrate may include other features such as shallow trench isolations configured to isolate various devices.

The semiconductor structure 200 includes metal gate stacks for field-effect transistor (FET) such as nFETs and pFETs. In one embodiment, the FETs include MOSFETs having a high k dielectric material layer for gate dielectric and a metal layer for gate electrode. As illustrated in FIG. 5a, the semiconductor structure 200 includes an NMOS transistor, referred to as 231a (only a portion of the NMOS transistor is shown in FIG. 5a for simplicity) and a PMOS transistor, referred to as 231b (similarly, only a portion of the NMOS transistor is shown in FIG. 5a for simplicity).

The metal gate stack of the NMOS includes a high k dielectric material layer 232 and may additionally include a thin silicon oxide underlying the high k dielectric material layer, formed by thermal oxidation, ALD or other suitable method. The metal gate stack of the NMOS includes a titanium nitride (TiN) layer 234. In one example, the titanium nitride layer 234 has a thickness of about 20 angstrom. In one embodiment, the above silicon oxide layer, the high k dielectric layer and the TiN layer are formed before the gate patterning and the S/D implantation. The metal gate stack of the NMOS also includes a second TiN layer 250 formed after the gate patterning and the S/D implantation. This TiN layer 250 has a thickness of about 40 A in one example. The metal gate stack of the NMOS further includes a TiAl or TiAlN layer 252 formed on the second TiN layer 250. The TiAl/TiAlN layer 252 has a thickness of about 50 A in one example. The metal gate stack of the NMOS additionally includes a metal material 242 filled in the gate trench between the gate spacers after the polysilicon removal. The filled metal includes tungsten or aluminum deposited by a CVD process or other suitable process, for examples. The second TiN layer 250 and TiAl/TiAlN layer 252 are formed in the gate trench of the NMOS after the polysilicon removal.

The metal gate stack of the PMOS includes a high k dielectric material layer 232 and may additionally include a thin silicon oxide underlying the high k dielectric material layer, formed by thermal oxidation, ALD or other suitable method. The high k dielectric layer of the PMOS is similar to the high k dielectric layer of the NMOS and can be formed in a single process. The metal gate stack of the NMOS includes a titanium nitride (TiN) layer 234. In one embodiment, the titanium nitride layer 234 has a thickness of about 20 angstrom. The TiN layer of the PMOS is similar to the TiN dielectric layer of the NMOS and can be formed in a single process. In one embodiment, the above silicon oxide layer, the high k dielectric layer and the TiN layer are formed before the gate patterning and the S/D implantation. The metal gate stack of the PMOS also includes a second TiN layer 250 formed after the gate patterning and the S/D implantation. The second TiN layer has a thickness of about 40 A in one example. The metal gate stack of the PMOS further includes a tungsten nitride (WN) layer 254 formed on the second TiN layer 250. The WN layer has a thickness of about 50 angstrom in one example. The metal gate stack of the PMOS further includes a TiAl or TiAlN layer 252 formed on the second TiN layer 250 and may be formed with the similar layer of the NMOS in a single process. The TiAl/TiAlN layer 252 has a thickness of about 50 A in one example. The metal gate stack of the PMOS additionally includes a metal material 242 filled in the gate trench between the gate spacers after the polysilicon removal. The filled metal includes tungsten or aluminum deposited by a CVD process, for examples. The second TiN layer, WN layer and TiAl/TiAlN layer are formed in the gate trench of the PMOS after the polysilicon removal. The disclosed materials for the metal gate stack of the NMOS and the metal gate stack of the PMOS are further provided in "Proposal A" columns of Table 1, in which the "NMOS" column provides various materials for NMOS gate stack and the "PMOS" column provides various materials for PMOS gate stack. "v" stands for that the referred material layer presents and "x" stands for that the referred material does not present. The term "IL" in Table 1 stand for an interfacial layer. One example of the IL layer is a thin silicon oxide layer. The thin silicon oxide layer can be formed by thermal oxide or atomic layer deposition (ALD). The "HK" stands for the high k dielectric material layer. The film "TiAl" can be TiAl or alternatively TiAlN. The term "RPG" stands for replacement polysilicon gate, representing a gate-last process in which a polysilicon gate stack is formed first, then ion implantation process to form source and drain regions, then remove polysilicon and formed various metal material layers to form high k and metal gate stacks. The terminology is also applicable to Table 2 and the rest of the Table 1.

Figure 5B:
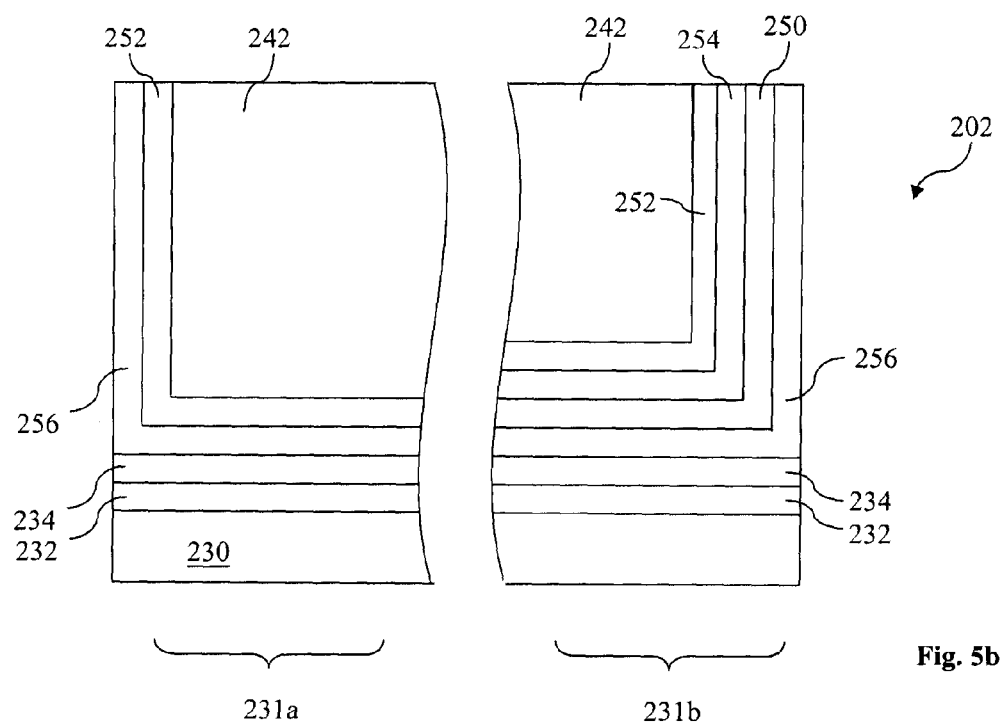

The semiconductor structure 202 is illustrated in FIG. 5b. The semiconductor structure 202 includes a semiconductor substrate 230 having various doped region, such as n-wells, p-wells, LDD regions, and source/drain regions. The semiconductor substrate may include other features such as shallow trench isolations configured to isolate various devices.

The semiconductor structure 202 includes metal gate stacks for field-effect transistor (FET) such as nFETs and pFETs. In one embodiment, the FETs include MOSFETs using high k dielectric material layer for gate dielectric and a metal layer for gate electrode. As illustrated in FIG. 5b, the semiconductor structure 202 includes an NMOS transistor 231a and a PMOS transistor 231b.

The metal gate stack of the NMOS includes a high k dielectric material layer 232 and may additionally include a thin silicon oxide underlying the high k dielectric material layer. The metal gate stack of the NMOS includes a titanium nitride (TiN) layer 234. In one embodiment, the titanium nitride layer 234 has a thickness of about 20 angstrom. In one embodiment, the above silicon oxide layer, the high k dielectric layer and the TiN layer are formed before the gate patterning and the source/drain (S/D) implantation. The metal gate stack of the NMOS includes a TaN layer 256. The TaN layer 256 has a thickness of about 10 angstrom in one example. The metal gate stack of the NMOS further includes a TiAl or TiAlN layer 252 formed on the TaN layer. The TiAl/TiAlN layer has a thickness of about 50 A in one example. The metal gate stack of the NMOS additionally includes a metal material 242 filled in the gate trench between the gate spacers after the polysilicon removal. The filled metal material 242 includes tungsten, aluminum, or other suitable conductive material in various examples. In one embodiment, the TaN layer and TiAl/TiAlN layer are formed in the gate trench of the NMOS after the polysilicon removal.

The metal gate stack of the PMOS includes a high k dielectric material layer 232 and may additionally include a thin silicon oxide underlying the high k dielectric material layer. The high k dielectric layer of the PMOS is similar to the high k dielectric layer of the PMOS and can be formed in a single process. A TiN layer 234 is further formed on the high k dielectric layer. The TiN layer 234 may have a thickness of about 20 A in one example and may be formed with the TiN layer of PMOS in a single step. In one embodiment, the above silicon oxide layer, the high k dielectric layer and the TiN layer are formed before the gate patterning and the S/D implantation. The metal gate stack of the PMOS includes a TaN layer 256 similar to the TaN layer of the NMOS and can be formed in a single process. The metal gate stack of the PMOS includes a second TiN layer 250 disposed on the TaN layer 256. In one embodiment, the second titanium nitride layer 250 has a thickness of about 40 angstrom. The metal gate stack of the PMOS further includes a tungsten nitride (WN) layer 254 formed on the second TiN layer 250. The WN layer 254 has a thickness of about 50 angstrom in one example. The metal gate stack of the PMOS further includes a TiAl or TiAlN layer 252 formed on the second TiN layer 250. The TiAl/TiAlN layer 252 has a thickness of about 10 A in one example. The metal gate stack of the PMOS additionally includes a metal material 242 filled in the gate trench between the gate spacers after the polysilicon removal. The filled metal material 242 includes tungsten or aluminum deposited by a CVD process or other suitable process. In one embodiment, the TaN layer, second TiN layer, WN layer and TiAl/TiAlN layer are formed in the gate trench of the PMOS after the polysilicon removal. The disclosed materials for the metal gate stack of the NMOS and the metal gate stack of the PMOS are further provided in "Proposal B" columns of Table 1. In another embodiment, The TaN layer is formed in both NMOS and PMOS gate trenches after the poly removal. Then the TiN layer and WN layer are deposited on the substrate and patterned such that these two layers are only remained in the PMOS. Then the TiAl/TiAlN layer is formed on both NMOS and PMOS gate trenches. Then an Al or W layer is further filled in both the NMOS and PMOS gate trenches. Then a CMP process is applied to the substrate to remove the excessive portions of the metal layers to form N metal gate stack and P metal gate stack.

Figure 5C:
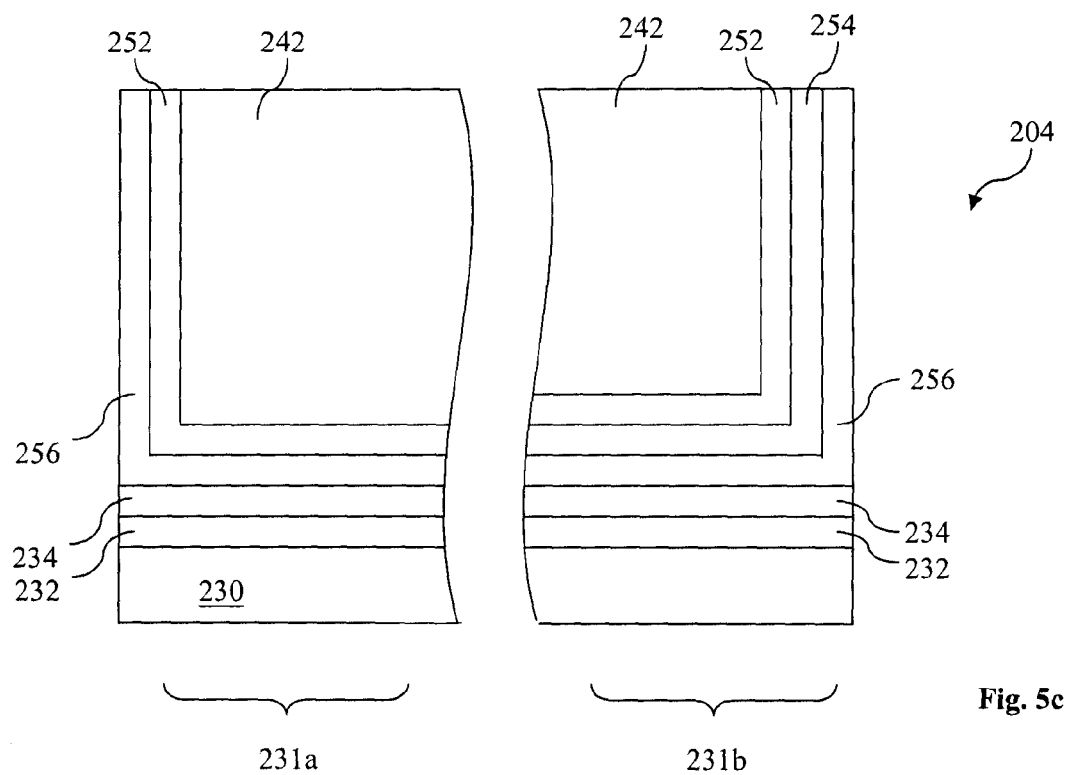

The semiconductor structure 204 is illustrated in FIG. 5c. The semiconductor structure 204 is similar to the substrate 200 FIG. 5a. The disclosed materials for the metal gate stack of the NMOS and the metal gate stack of the PMOS are illustrated in FIG. 5c with various thickness examples and further provided in "Proposal C" columns of Table 1. In term of configuration, composition and formation, the semiconductor structure 204 is similar to the semiconductor structure 200 of FIG. 5a except for the second TiN layer for both the NMOS and PMOS is replaced by a TaN layer 256. The TaN layer 256 may have a thickness of about 10 angstrom in one example. In another embodiment, the TiAl/TiAlN layer 252 in both NMOS and PMOS may have a thickness of 10 angstrom in one example.

Figure 5D:
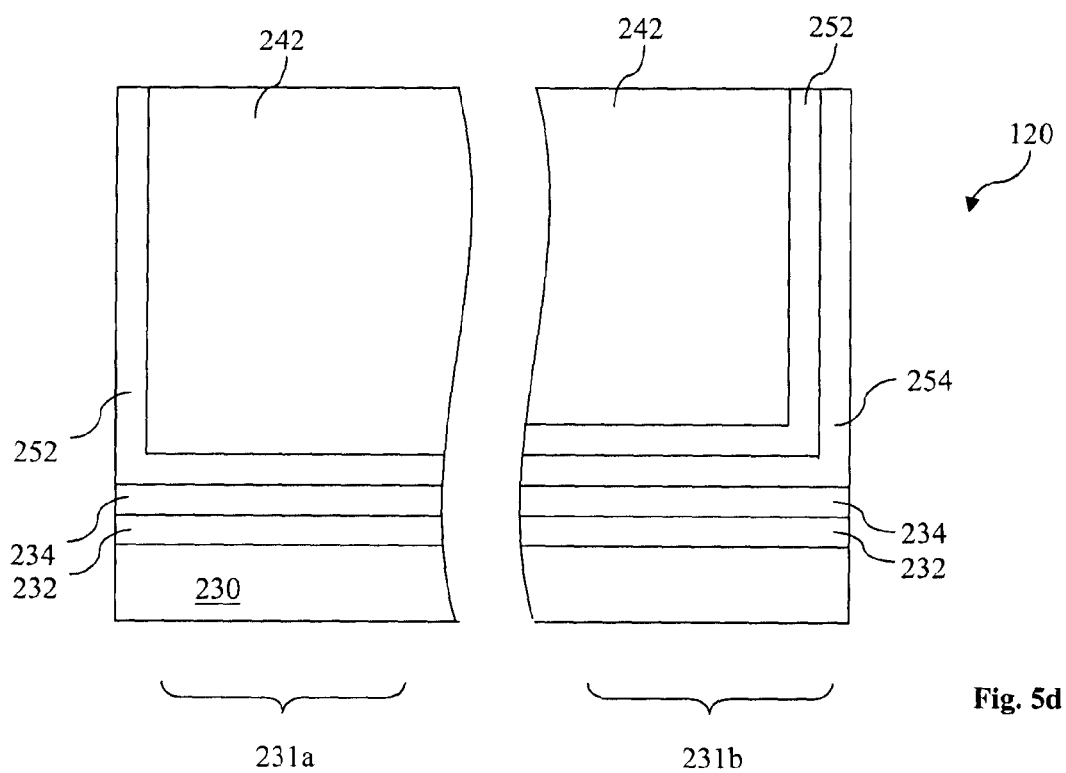

The semiconductor structure 206 is illustrated in FIG. 5d. The semiconductor structure 206 is similar to the substrate 202 FIG. 5b. The disclosed materials for the metal gate stack of the NMOS and the metal gate stack of the PMOS are illustrated in FIG. 5d with various dimensional embodiments and further provided in "Proposal D" columns of Table 1. In term of configuration, composition and formation, the semiconductor structure 206 is similar to the semiconductor structure 202 of FIG. 5b except for the second TiN layer of the PMOS is eliminated and the TaN layer for both NMOS/PMOS is eliminated.

FIGS. 6a through 6f are sectional views of various embodiments of a semiconductor structure having metal gate stacks constructed according to aspects of the present disclosure. The structures of FIGS. 6a through 6f include one or more patterned metal layers in NMOS transistors. In one embodiments of the structures of FIGS. 6a through 6f, the patterned metal layer(s) is(are) formed on the NMOS transistors by deposition and etching processes. Thereafter, one or more other metal layers are formed to both NMOS and PMOS transistors. Therefore, the structures of FIGS. 6a through 6f are referred to as P pattern first in the Table 2. In various embodiments, the structures of FIGS. 6a through 6f may utilize the method 120 of FIG. 2, the method 140 of FIG. 3 or a combination thereof. The semiconductor structures of FIGS. 6a through 6f are described below with additional reference to Table 2.

Figure 6A:
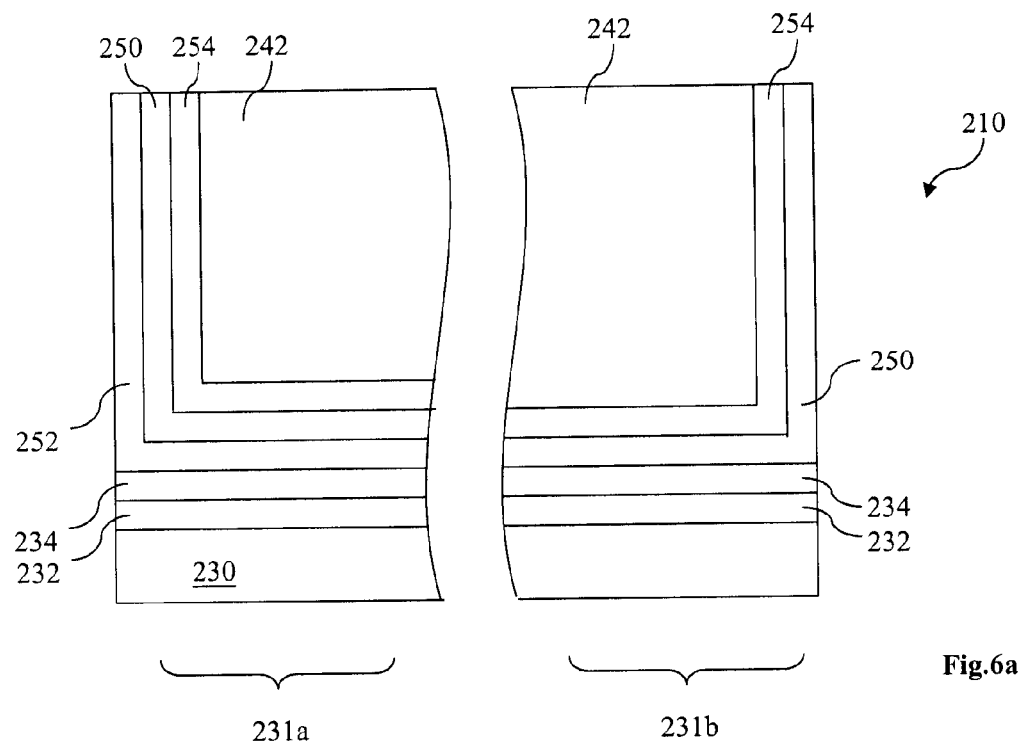
FIGS. 6a through 6f are sectional views of a semiconductor structure having metal gate stacks at a fabrication stage constructed according to various aspects of the present disclosure in various embodiments.

The semiconductor structure 210 is illustrated in FIG. 6a. The semiconductor structure 200 includes a semiconductor substrate 230 having various doped region, such as n-wells, p-wells, LDD regions, and source/drain regions. The semiconductor substrate 230 may include other features such as shallow trench isolations configured to isolate various devices.

The semiconductor structure 210 includes metal gate stacks for field-effect transistor (FET) such as nFETs and pFETs. In one embodiment, the FETs include MOSFETs using high k dielectric material layer for gate dielectric and a metal layer for gate electrode. As illustrated in FIG. 6a, the semiconductor structure 210 includes an NMOS transistor 231a and a PMOS transistor 231b.

The metal gate stack of the NMOS includes a high k dielectric material layer 232 and may additionally include a thin silicon oxide (not shown) underlying the high k dielectric material layer. The metal gate stack of the NMOS includes a titanium nitride (TiN) layer 234. In one embodiment, the titanium nitride layer 234 has a thickness of about 20 angstrom. In one embodiment, the above silicon oxide layer, the high k dielectric layer and the TiN layer are formed before the gate patterning and the S/D implantation.

The metal gate stack of the NMOS includes a TiAl or TiAlN layer 252 formed on the TiN layer 234. The TiAl/TiAlN layer 252 has a thickness of about 50 Å in one example. The metal gate stack of the NMOS includes a second TiN layer 250. This TiN layer 250 has a thickness of about 40 Å in one example. The metal gate stack of the NMOS also includes a WN layer 254. The thickness of the WN layer 254 is about 50 Å in one example. The metal gate stack of the NMOS additionally includes a metal material 242 filled in the gate trench between the gate spacers after the polysilicon removal. The filled metal material 242 includes tungsten or aluminum deposited by a CVD process, for examples. The TiAl/TiAlN layer, second TiN layer and WN layer are formed in the gate trench of the NMOS after the polysilicon removal.

The metal gate stack of the PMOS includes a high k dielectric material layer 232 and may additionally include a thin silicon oxide underlying the high k dielectric material layer. The high k dielectric layer 232 of the PMOS is similar to the high k dielectric layer of the NMOS and can be formed in a single process. Additionally, the metal gate stack of the PMOS includes a titanium nitride (TiN) layer 234. In one embodiment, the titanium nitride layer 234 has a thickness of about 20 angstrom. In one embodiment, the above silicon oxide layer, the high k dielectric layer and the TiN layer are formed before the gate patterning and the S/D implantation. The metal gate stack of the PMOS includes a second titanium nitride (TiN) layer 250. In one embodiment, the titanium nitride layer 250 has a thickness of about 40 angstrom. The metal gate stack of the PMOS further includes a tungsten nitride (WN) layer 254 formed on the second TiN layer 250. The WN layer 254 has a thickness of about 50 angstrom in one example. The metal gate stack of the PMOS additionally includes a metal material 242 filled in the gate trench between the gate spacers after the polysilicon removal. The filled metal material 242 includes tungsten or aluminum deposited by a CVD process, for examples. The second TiN layer, WN layer and the filled W/Al layer are formed in the gate trench of the PMOS after the polysilicon removal. The disclosed materials for the metal gate stack of the NMOS and the metal gate stack of the PMOS are further provided in "Proposal A" columns of Table 2.

Figure 6B:
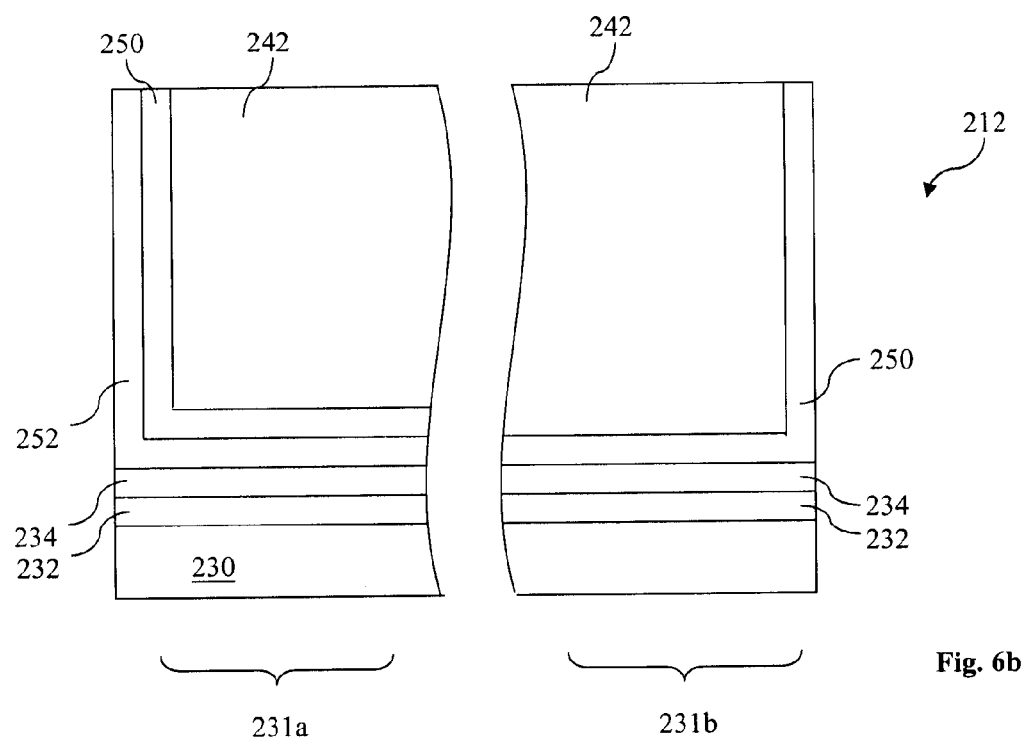

The semiconductor structure 212 is illustrated in FIG. 6b. The semiconductor structure 212 is similar to the semiconductor structure 210 of FIG. 6a in terms of configuration, formation and composition except for the WN layer is eliminated from the both NMOS and PMOS regions.

Figure 6C:
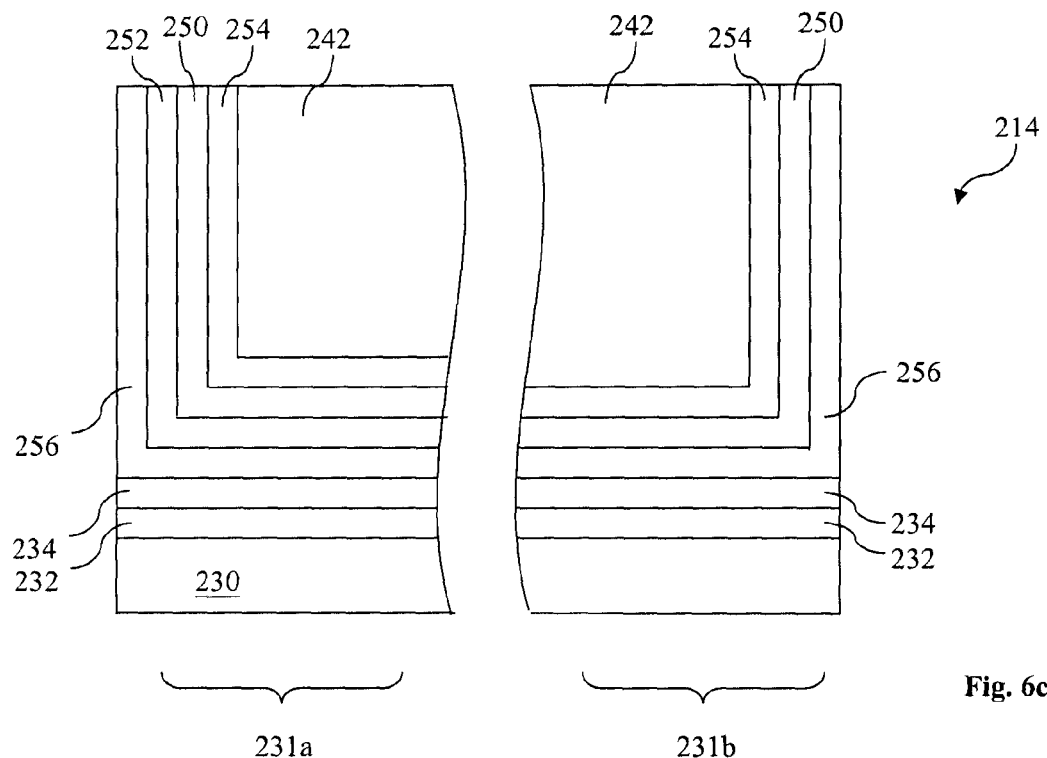

The semiconductor structure 214 is illustrated in FIG. 6c and is further provided in "Proposal B" columns of the Table 2. The semiconductor structure 214 is similar to the semiconductor structure 210 of FIG. 6a in terms of configuration, formation and composition except for a TaN layer is additionally formed on both NMOS and PMOS metal gate stacks. The TaN layer may have a thickness of about 10 angstrom in one example. The TaN layer may be formed in the metal gate stack before the gate patterning and source/drain implantation in one embodiment. In another embodiment, the TaN layer is formed after the polysilicon removal.

Figure 6D:
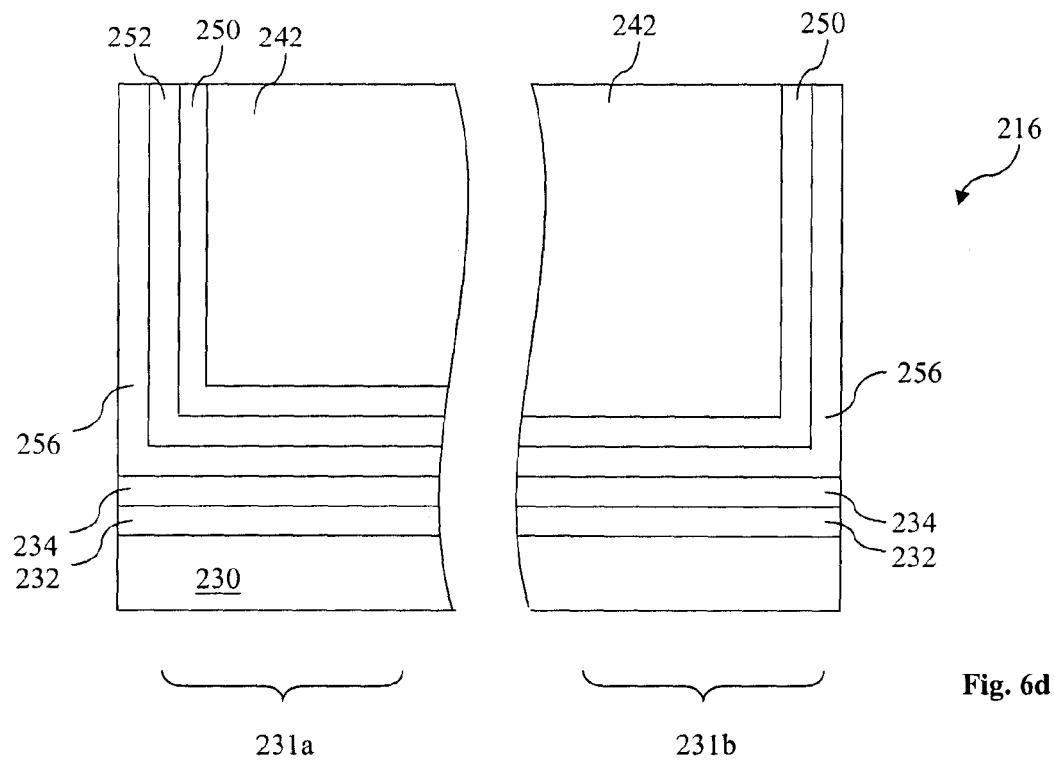

The semiconductor structure 216 is illustrated in FIG. 6d. The semiconductor structure 216 is similar to the semiconductor structure 214 of FIG. 6c in terms of configuration, formation and composition except for the WN layer is eliminated from the both NMOS and PMOS regions.

Figure 6E:
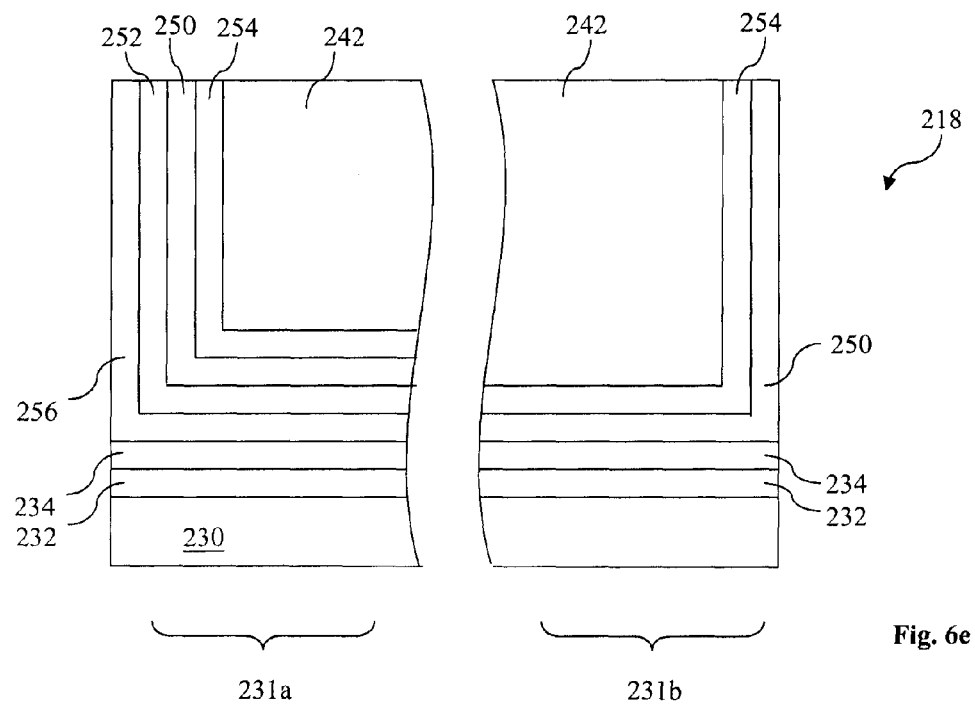

The semiconductor structure 218 is illustrated in FIG. 6e and is further provided in "Proposal C" columns of the Table 2. The semiconductor structure 218 is similar to the semiconductor structure 210 of FIG. 6a in terms of configuration, formation and composition except for a patterned TaN layer 256 is additionally formed on only NMOS metal gate stacks. The TaN layer 256 may have a thickness of about 10 angstrom in one example. The TaN layer 256 and the TiAl/TiAlN layer 252 are formed on the NMOS metal gate stacks after the polysilicon removal.

Figure 6F:
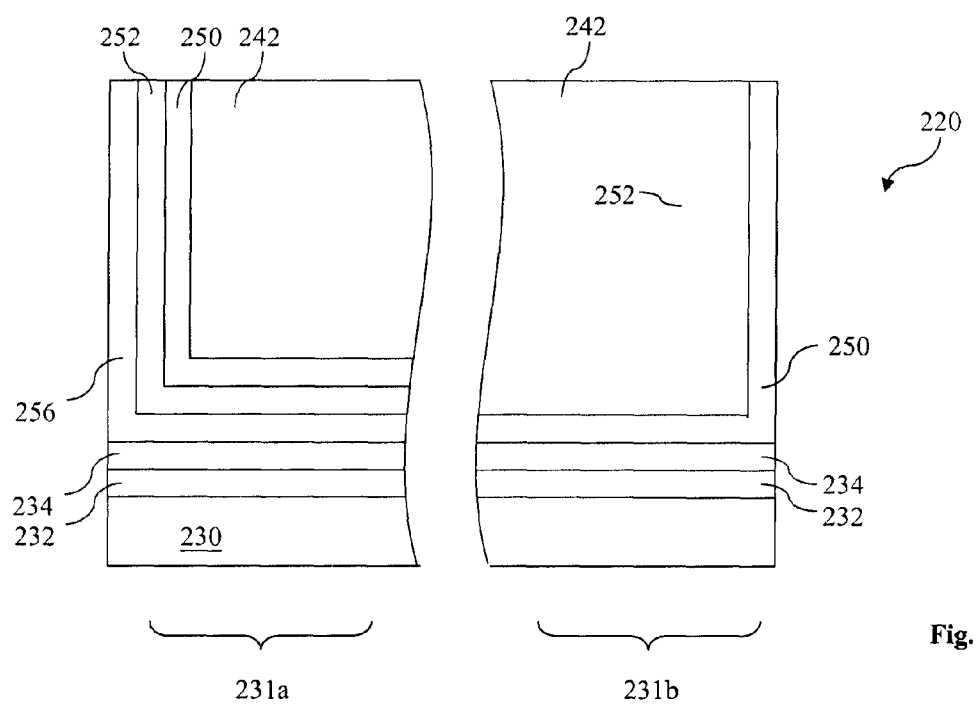

The semiconductor structure 220 is illustrated in FIG. 6f. The semiconductor structure 220 is similar to the semiconductor structure 218 of FIG. 6e in terms of configuration, formation and composition except for the WN layer is eliminated from the both NMOS and PMOS regions.

By the disclosed structures and methods in various embodiments, the metal gate stacks for nFETs and pFETs are formed with different compositions and configurations. The work functions for nFET and pFET regions are tuned independently. In various embodiments, the performances of the nMOSFETs and pMOSFETs are optimized and enhanced. The issues associated with previous metal gate formation are eliminated or reduced.

The present method and the semiconductor structure include various alternatives. For example, the high k dielectric material layer can be formed by a suitable process such as an atomic layer deposition (ALD). Other methods to form the high k dielectric material layer include metal organic chemical vapor deposition (MOCVD), physical vapor deposition (PVD), and molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. The interfacial layer interposed between the semiconductor substrate and the high k dielectric layer can be silicon oxide and may be formed by various suitable methods such as thermal oxidation, ALD or UV-Ozone Oxidation. The interfacial silicon oxide layer may have a thickness less than 10 A. In another example, the silicon oxide layer has a thickness of about 5 angstrom.

The various metal gate layer can be formed by PVD or other suitable process. The disclosed semiconductor structures may include an additional capping layer interposed between the high k dielectric material layer and the metal gate layer(s). The capping layer includes lanthanum oxide (LaO) in one example. The capping layer may alternatively includes other suitable material. The polysilicon layer may be formed by CVD or other suitable method.

The various patterning process may include forming a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

In another embodiment, the various patterning process may include forming an additional patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or SiH2Cl2), bis(TertiaryButylAmino)silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

Although not shown, other processing step may present to form various doped regions such as source and drain regions, devices features such as multilayer interconnection (MLI). In one example, The light doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structures in various embodiments and the methods of making the same may be used in other semiconductor devices having a high k and metal gate features, such as strained semiconductor substrate, a hetero-semiconductor device or a stress-free isolation structure.

The present disclosure is not limited to applications in which the semiconductor structure includes a MOS transistor, and may be extended to other integrated circuit having a metal gate stack. For example, the semiconductor structures may include a dynamic random access memory (DRAM) cell, a single electron transistor (SET), and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making metal gate stacks of a semiconductor device. The method includes forming a high k dielectric material layer on a semiconductor substrate; forming a conductive material layer on the high k dielectric material layer; forming a dummy gate in a n-type field-effect transistor (nFET) region and a second dummy gate in a pFET region employing polysilicon; forming an inter-level dielectric (ILD) material on the semiconductor substrate; applying a first chemical mechanical polishing (CMP) process to the semiconductor substrate; removing the polysilicon from the first dummy gate, resulting in a first gate trench; forming a n-type metal to the first gate trench; applying a second CMP process to the semiconductor substrate; removing the polysilicon from the second dummy gate, resulting in a second gate trench; forming a p-type metal to the second gate trench; and applying a third CMP process to the semiconductor substrate.

The disclosed method may further include forming a patterned photoresist layer to cover the pFET region before the removing of the polysilicon from the first dummy gate. The forming the conductive material layer may include forming a titanium nitride layer on the high k dielectric material layer. The method may further include forming a tantalum nitride layer on the conductive material layer. The method may further include forming a patterned tungsten nitride in the pFET region. The forming of the n-type metal may include forming a tantalum nitride layer; and forming a conductive layer selected from the group consisting of titanium aluminum and titanium aluminum nitride. The forming of the p-type metal may include forming a second titanium nitride layer; and forming a tungsten nitride layer on the second titanium nitride layer.

The present disclosure also provides one embodiment of an integrated circuit having metal gate stacks. The integrated circuit includes a semiconductor substrate; a first gate stack of a n-type field-effect transistor (nFET) having a high k dielectric layer on the semiconductor substrate; a titanium nitride layer on the high k dielectric material layer; a first metal layer on the titanium nitride layer; and a second metal layer on the first metal layer. The integrated circuit also includes a second gate stack of a p-type FET having the high k dielectric layer on the semiconductor substrate; the titanium nitride layer on the high k dielectric material layer; the first metal layer on the titanium nitride layer; a third metal layer on the first metal layer; and the second metal layer on the third metal layer. The first metal layer may include tantalum nitride. The second metal layer my include at least one of titanium aluminum and titanium aluminum nitride. The third metal layer may include tungsten nitride.

The present disclosure also provides another embodiment of an integrated circuit having metal gate stacks. The integrated circuit includes a semiconductor substrate; a first gate stack of a n-type field-effect transistor (nFET) having a high k dielectric layer on the semiconductor substrate; a titanium nitride layer on the high k dielectric material layer; a first metal layer on the titanium nitride layer; and a second metal layer on the first metal layer. The integrated circuit also includes a second gate stack of a p-type FET having the high k dielectric layer on the semiconductor substrate; the titanium nitride layer on the high k dielectric material layer; a third metal layer on the first metal layer; and a forth metal layer on the third metal layer.

According to various embodiment of the disclosed integrated circuit, the first metal layer may include tantalum nitride. The second metal layer may include at least one of titanium aluminum and titanium aluminum nitride. The third metal layer may include titanium nitride. The third metal layer may include tungsten nitride.

The present disclosure also provides another embodiment of a method for making metal gate stacks of a semiconductor device. The integrated circuit includes forming a high k dielectric material layer on a semiconductor substrate; forming a conductive material layer on the high k dielectric material layer; forming a first dummy gate in a n-type field-effect transistor (nFET) region and a second dummy gate in a pFET region employing polysilicon; forming an inter-level dielectric (ILD) material on the semiconductor substrate; applying a first chemical mechanical polishing (CMP) process to the semiconductor substrate; removing the polysilicon from the first dummy gate and the second dummy gate, resulting in a first gate trench and a second gate trench, respectively; forming a n-type metal layer on the first gate trench and the second gate trench; applying a second CMP process to the semiconductor substrate; removing the n-type metal layer from the second gate trench; forming a p-type metal to the second gate trench; and applying a third CMP process to the semiconductor substrate.

In various examples, the removing of the n-type metal layer may further include forming a patterned photoresist layer to cover the nFET region. The forming the conductive material layer may include forming a titanium nitride layer on the high k dielectric material layer. The forming of n-type metal layer may include forming a tantalum nitride (TaN) layer; and forming one of a TiAl layer and a TiAlN layer on the TaN layer. The forming of p-type metal layer may include forming a tantalum nitride (TaN) layer; forming a tungsten nitride (WN) layer on the TaN layer; and forming one of a TiAl layer and a TiAlN layer on the WN layer. The forming of p-type metal layer may include forming a titanium nitride (TiN) layer; and forming a tungsten nitride (WN) layer on the TiN layer.

The present disclosure also provides another embodiment of a method for making metal gate stacks of a semiconductor device. The method includes providing a semiconductor substrate having a first gate trench in a first type field-effect transistor (FET) and a second gate trench in a second type FET; forming a patterned metal feature in the first gate trench; and thereafter forming a first metal layer in both the first gate trench and the second gate trench.

The method may further include filling a second metal layer to both the first and second gate trenches; and applying a chemical mechanical polishing (CMP) process to the semiconductor substrate. The providing of the semiconductor substrate may include forming a high k dielectric material layer on the semiconductor substrate; forming a conductive material layer on the high k dielectric material layer; forming a polysilicon layer on the conductive layer; patterning the polysilicon layer, the conductive layer and the high k dielectric layer to form a first dummy gate stack of the first type FET and a second dummy gate stack of the second type FET; forming an inter-level dielectric (ILD) material on the semiconductor substrate; applying a first chemical mechanical polishing (CMP) process to the semiconductor substrate; and removing the polysilicon from the first dummy gate and the second dummy gate, resulting in a first gate trench and a second gate trench, respectively. In various examples of the disclosed method, the first type of FET includes one of a n-type FET and a p-type FET; and the second type of FET includes the another one of a n-type FET and a p-type FET.

The present disclosure also provides another embodiment of an integrated circuit having metal gate stacks. The method includes a semiconductor substrate; a first gate stack of a n-type field-effect transistor (nFET) having a high k dielectric layer; a first metal layer on the high k dielectric layer; and a second metal layer on the first metal layer. The integrated circuit also includes a second gate stack of a p-type FET having the high k dielectric layer; and the second third metal layer on the high k dielectric layer first metal layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit having metal gate stacks, comprising:
    a semiconductor substrate;
    a first gate stack of an n-type field-effect transistor, the first gate stack including:
        a high k dielectric layer on the semiconductor substrate;
        a titanium nitride layer on the high k dielectric material layer;
        a first metal layer on the titanium nitride layer, the first metal layer comprised of one of titanium nitride and tantalum nitride; and
        a second metal layer on the first metal layer such that the second metal layer physically contacts the first metal layer; and
    a second gate stack of a p-type FET, the second gate stack including:
        the high k dielectric layer on the semiconductor substrate;
        the titanium nitride layer on the high k dielectric material layer;
        a third metal layer on the titanium nitride layer, wherein the third metal layer is different from the first and second metal layers; and
        a fourth metal layer on the third metal layer,
        wherein the second metal layer comprises at least one of titanium aluminum and titanium aluminum nitride in physical contact with the first metal layer.

2. The integrated circuit of claim 1, wherein the second gate stack further comprises the first metal layer interposed the third metal layer and the titanium nitride layer.

3. The integrated circuit of claim 2, wherein the second metal layer and the fourth metal layer are substantially same in composition.

4. The integrated circuit of claim 1, wherein the first metal layer comprises tantalum nitride.

5. The integrated circuit of claim 1, wherein the third metal layer comprises one of titanium nitride and tungsten nitride.

6. An integrated circuit comprising:
    a semiconductor substrate;
    a first gate stack of an n-type field-effect transistor, the first gate stack including:
        a high k dielectric layer on the semiconductor substrate;
        a first metal layer disposed over the high k dielectric material layer;
        a second metal layer on the first metal layer, the second metal layer being different than the first metal layer; and
        a third metal layer on the second metal layer, the third metal layer being different than the second metal layer; and
    a second gate stack of a p-type FET, the second gate stack including:
        the high k dielectric layer on the semiconductor substrate;
        the first metal layer disposed over the high k dielectric material layer;
        a fourth metal layer on the first metal layer, the fourth metal layer being different than the first metal layer; and
        a fifth metal layer on the fourth metal layer, the fifth metal layer being different than the fourth metal layer,
        wherein one of the second, third, fourth, and fifth metal layers is a titanium aluminum layer.

7. The integrated circuit of claim 6, wherein the first metal layer comprises titanium nitride.

8. The integrated circuit of claim 6, wherein the third metal layer is formed of a first material and the fifth metal layer is formed of a second material, the first material being different from the second material.

9. The integrated circuit of claim 6, wherein the second metal layer and the fourth metal layer are substantially same in composition.

10. The integrated circuit of claim 6, wherein the first metal layer comprises titanium nitride,
    wherein the second and fourth metal layers comprise tantalum nitride,
    wherein the third metal layer is the titanium aluminum layer, and wherein the fifth metal layer comprises one of tungsten nitride and titanium nitride.

11. The integrated circuit of claim 6, further comprising:
a sixth metal layer disposed over the fifth metal layer, the sixth metal layer and the third metal layer are substantially same in composition.

12. The integrated circuit of claim 11, further comprising:
a seventh metal layer interposed between the sixth metal layer and the fifth metal layer, the seventh metal layer including tungsten nitride.

13. The integrated circuit of claim 6, wherein the first metal layer comprises titanium nitride,
wherein the second metal layer is the titanium aluminum layer,
wherein the fourth metal layer comprises tungsten nitride, and
wherein the third metal layer and the fifth metal layer have different compositions.

14. An integrated circuit comprising:
a semiconductor substrate;
a first gate stack of an n-type field-effect transistor, the first gate stack including:
a high k dielectric layer on the semiconductor substrate;
a titanium nitride layer disposed on the high k dielectric material layer;
a first metal layer on the titanium nitride layer, the first metal layer being different than the titanium nitride layer;
a second metal layer on the first metal layer, the second metal layer being different than the first metal layer; and
wherein at least one of the first and second metal layers is a titanium aluminum layer, and
a second gate stack of a p-type FET, the second gate stack including:
the high k dielectric layer on the semiconductor substrate;
the titanium nitride layer on the high k dielectric material layer;
a third metal layer disposed over the titanium nitride layer; and
a fourth metal layer on the third metal layer, the fourth metal layer being different than the third metal layer.

15. The integrated circuit of claim 14, wherein the first metal layer is formed of a first material and the third metal layer is formed of a second material, the first material being different from the second material.

16. The integrated circuit of claim 14, wherein the first metal layer and the third metal layer are substantially same in composition.

17. The integrated circuit of claim 14, wherein the first metal layer is the titanium aluminum layer,
wherein the second metal layer comprises titanium nitride, and
wherein fourth metal layer is different than the second metal layer.

18. The integrated circuit of claim 14, wherein the first metal layer comprises tantalum nitride,
wherein the second metal layer is the titanium aluminum layer,
wherein the third metal layer comprises one of tantalum nitride and titanium nitride, and
wherein the fourth metal layer comprises one of titanium nitride, tungsten nitride, tungsten, and aluminum.

19. The integrated circuit of claim 14, further comprising:
a fifth metal layer disposed on the second metal layer, the fifth metal layer being different than the second metal layer, and
a sixth metal layer disposed on the fourth metal layer, the sixth metal layer being different than the fourth metal layer.

20. The integrated circuit of claim 14, wherein the second metal layer comprises only titanium aluminum.

* * * * *